US012574041B2

(12) United States Patent　　　　　(10) Patent No.: US 12,574,041 B2
Typrowicz et al.　　　　　　　　　　　(45) Date of Patent: Mar. 10, 2026

(54) ELECTRICAL CIRCUIT OF SIGNAL CONDITIONING AND MEASUREMENT DEVICE

(71) Applicant: Aptiv Technologies AG, Schaffhausen (CH)

(72) Inventors: Wojciech Typrowicz, Bęczyn (PL); Janusz Debski, Wieliczka (PL); Krzysztof Tokarz, Łapczyca (PL)

(73) Assignee: Aptiv Technologies AG, Schaffhausen (CH)

( * ) Notice: Subject to any disclaimer, the term of this patent is extended or adjusted under 35 U.S.C. 154(b) by 127 days.

(21) Appl. No.: 18/408,729

(22) Filed: Jan. 10, 2024

(65) Prior Publication Data

US 2024/0243753 A1　　Jul. 18, 2024

(30) Foreign Application Priority Data

Jan. 12, 2023　(GB) ..................................... 2300491

(51) Int. Cl.
　H03M 1/12　　　(2006.01)
　H03M 1/06　　　(2006.01)
　H03M 1/18　　　(2006.01)
　H03M 1/36　　　(2006.01)
(52) U.S. Cl.
　CPC ........... H03M 1/125 (2013.01); H03M 1/069 (2013.01); H03M 1/182 (2013.01); H03M 1/361 (2013.01)
(58) Field of Classification Search
　CPC .... H03M 1/125; H03M 1/1069; H03M 1/182; H03M 1/361

USPC .......................................... 341/155, 118, 120
See application file for complete search history.

(56) References Cited

U.S. PATENT DOCUMENTS

| | | | |
|---|---|---|---|
| 2008/0101802 A1 | 5/2008 | Yano | |
| 2009/0016392 A1 | 1/2009 | Wong | |
| 2013/0336650 A1 | 12/2013 | Azadeh | |
| 2014/0197975 A1 | 7/2014 | Cohen | |
| 2018/0224516 A1* | 8/2018 | Geisler | ................. G01D 21/00 |
| 2022/0178769 A1 | 6/2022 | Garrard et al. | |
| 2024/0310496 A1* | 9/2024 | Gong | ..................... G01S 7/497 |

OTHER PUBLICATIONS

Extended European Search Repot for EP24150438.0 dated Jun. 11, 2024, 9 pages.
Lopez-Martin et al., "Performance Tradeoffs of Three Contactless Angle Detection Systems," IEEE Sensors 2007 Conference, pp. 272-275 Oct. 28, 2007.
Combined Search and Examination Report for GB2300491.4 dated Jul. 3, 2023, 6 pages.

* cited by examiner

*Primary Examiner* — Peguy Jean Pierre
(74) *Attorney, Agent, or Firm* — Miller Johnson

(57)　　　　　　　ABSTRACT
An electrical circuit for conditioning an analog electrical input signal into an analog electrical output signal includes a threshold circuit. The threshold circuit is configured to set a value of a conditioning parameter, under control of the analog electrical input signal and based on an electrical threshold. The threshold circuit is configured to set the conditioning parameter to, in response to the analog electrical input signal being below the electrical threshold, a first value. The threshold circuit is configured to set the conditioning parameter to, in response to the analog electrical input signal exceeding the electrical threshold, a second value different from the first value.

14 Claims, 3 Drawing Sheets

ELECTRICAL CIRCUIT OF SIGNAL CONDITIONING AND MEASUREMENT DEVICE

CROSS-REFERENCE TO RELATED APPLICATIONS

This application claims priority to GB2300491.4 filed Jan. 12, 2023, the entire disclosure of which is incorporated by reference.

FIELD

The present disclosure relates to an electrical circuit of signal conditioning, and to a measurement device including the electrical circuit of signal conditioning.

BACKGROUND

In the automotive field, modern vehicles are provided with electronic computer units (ECUs) that can carry out diagnostics by measuring various parameters. For that purpose, the vehicle has multiple sensors like temperature sensors, pressure sensors, gas sensors, force and torque sensors, etc. . . . . Generally, the sensors measure a physical parameter and convert the measured parameter into an electrical signal like voltage or current. The vehicle may also have sensors for measuring a current flowing through a device, or for measuring a voltage at the terminals of the device. The electrical signals are then converted into digital values by an analog to digital converter (ADC).

The analog to digital converter converts an analog input voltage or current to a digital value or number representing the magnitude of the voltage or current. The converter is characterized by an allowed range of analog input values and a given resolution. The resolution of the converter indicates the number of different, i.e. discrete, digital values it can produce. Let's consider an example of an ADC with an allowed range of analog input values between 0V and 5V and a resolution of 12 bits ($2^{12}$=4096 different levels or counts or different, i.e. discrete, units of digital values). The ADC can encode an analog input comprised within the range 0V-5V to one in 4096 different levels ($2^{12}$=4096). The values can represent the ranges from 0 to 4095 (i.e. as unsigned integers) or from −2048 to 2047 (i.e. as signed integer), depending on the application.

In some automotive applications, it is needed to measure electrical signals in a high dynamic range having low values and high values. For example, it may be necessary to measure a current having values ranging from a few milli-amperes to tens of amperes.

Therefore, a challenge is to provide a measurement device that can measure digital values of current or voltage for both high and low currents or voltages.

A first known approach is to make a tradeoff between low current performance and high current measurement capability. For example, before performing the analog-to-digital conversion by the ADC, the analog electrical signal to measure can be converted into another analog electrical signal having a constant output slope. The output slope is determined so that all values of the converted analog electrical signal are within the ADC measurement range (i.e., the range of allowed analog input values of the ADC). With the first approach, the resolution of measurement is the same for low currents or voltages and for high currents or voltages.

In a second known approach, the global range of values of the electrical signal to measure is divided into different sub-ranges that are respectively associated with different resolutions and can be switched by software means. Typically, for low currents or low voltages, the resolution of digital measurement is higher than for high currents or high voltages. In the second approach, a first measurement of the electrical signal needs to be performed to evaluate a range of the electrical signal. Then, the resolution is set for example by selecting a gain of an amplifier responsible for conditioning the electrical signal, based on the evaluated sub-range, and, if necessary, by setting the selected gain of the amplifier. The second approach is implemented with hardware and software. It requires to execute different steps:

measuring the electrical signal to evaluate the sub-range of the electrical signal, if necessary, changing the gain of the amplifier, based on the evaluated sub-range, measuring the electrical signal again with the amplifier having the appropriate gain.

The second approach requires time and computing resources. Furthermore, it may result in missing some measurements. Indeed, when the gain of the amplifier is changed, it is needed to wait for some time to settle the output and measure it again.

A third approach uses a logarithmic amplifier. Such a logarithmic amplifier has the advantage of a wide range. However, it is difficult to build a stable logarithmic amplifier over the temperature. Another drawback is that the use of a logarithmic amplifier requires to execute calculations with software, to calculate the logarithm, which requires computing resources and time.

Therefore, there is a need for conditioning an analog electrical signal before analog to digital conversion that solve the drawbacks of the prior art.

SUMMARY

The present disclosure concerns an electrical circuit of analog signal conditioning, configured to condition an analog electrical input signal into an analog electrical output signal, wherein the electrical circuit comprises at least one threshold circuit configured to set a value of a conditioning parameter, under control of the analog electrical input signal and based on a corresponding electrical threshold, the conditioning parameter having at least two different values, first and second, respectively if the analog electrical input signal is below said corresponding electrical threshold and if the analog electrical input signal exceeds said corresponding electrical threshold.

Thanks to that, the value of the conditioning parameter automatically changes based on the analog electrical input signal, by means of the threshold circuit: if the analog electrical input signal is below the electrical threshold provided by the threshold circuit, the conditioning parameter has a first value, and if the analog electrical input signal exceeds said electrical threshold, the conditioning parameter has a second value, different from the first value. The analog electrical input signal is used as a control signal that can control the threshold circuit. In an embodiment, the threshold circuit can be either conductive or not conductive, based on the analog electrical input signal.

In an embodiment, the conditioning parameter is an output slope corresponding to a ratio between a change in the analog electrical input signal and a corresponding change in the analog electrical output signal.

The threshold circuit may be configured to set the second value of the condition parameter lower than the first value of the conditioning parameter. Thanks to that, in case the analog electrical output signal is then converted to digital values, the analog-to-digital conversion has a higher resolution for low values than for high values of the analog electrical input signal.

In an embodiment, the electrical circuit may comprise an input interface to receive the analog electrical input signal, a first converter; at least one second converter, included in the at least one threshold circuit, configured so that if the analog electrical input signal is below said corresponding electrical threshold, the threshold circuit is not conductive, and the input interface provides the analog electrical input signal to the first converter only so as to set the first value of the conditioning parameter; if the analog electrical input signal exceeds said corresponding electrical threshold, the threshold circuit is conductive, and the input interface provides the analog electrical input signal to the first converter and to the second converter so as to set the second value of the conditioning parameter.

In an embodiment, the input interface may be configured to flow a current corresponding to the analog electrical input signal, and the electrical circuit may be configured to divide the input current path into a first current path through the first converter and at least a second current path through the at least second converter.

In an embodiment, the at least one threshold circuit may comprise a diode connected in series to the second converter; a voltage follower operational amplifier comprising a first input connected to a fixed threshold voltage node, a second input connected to a node between the second converter and an anode side of the diode, and an output connected to a cathode side of the diode, said corresponding electrical threshold of the analog electrical signal deriving from said fixed threshold voltage.

The first input of the voltage follower operational amplifier can be connected to a voltage source through a voltage divider circuit.

In an embodiment, the first converter may include a first resistor and the second converter may include a second resistor.

In another embodiment, the electrical circuit can comprise two or more threshold circuits configured to provide two or more corresponding electrical thresholds for the analog electrical input signal, different from each other, the conditioning parameter having at least three different values respectively within at least three different ranges of analog values of the analog electrical input signal, said ranges being delimited by said corresponding electrical thresholds.

In an embodiment, the electrical circuit can comprise an interconnection node interconnecting the input interface, the first converter, the at least one threshold circuit, and an output interface to output the analog electrical output signal.

In an embodiment, the threshold circuit can further comprise an analog-to-digital converter configured to receive as input said analog electrical output signal, the conditioning parameter being adapted to convert the analog electrical input signal into the analog electrical output signal within an allowed range of analog input values for the analog-to-digital converter.

The present disclosure also concerns a measurement device for measuring a physical parameter, including
a sensor configured to sense said physical parameter and output an analog electrical signal representative of the sensed physical parameter,
the electrical circuit as above-defined configured to receive as input the analog electrical signal from the sensor and convert said analog electrical signal from the sensor into a digital measurement signal.

The present disclosure also concerns a method for conditioning an analog electrical input signal, the method comprising the steps of
conditioning, by an electrical circuit of signal conditioning, the analog electrical input signal into an analog electrical output signal, and
in the step of conditioning, setting a value of a conditioning parameter, by controlling a threshold circuit of the electrical circuit of signal conditioning with the analog electrical input signal and based on at least one electrical threshold,
wherein the conditioning parameter has at least two different first and second values respectively if the analog electrical input signal is below said at least one electrical threshold and if the analog electrical input signal exceeds said at least one electrical threshold.

The conditioning parameter is for example an output slope corresponding to a ratio between a change in the analog electrical input signal and a corresponding change in the analog electrical output signal.

In an embodiment, the second value of the output slope is lower than the first value of the output slope.

In an embodiment, if the analog electrical input signal is below said at least one electrical threshold, the threshold circuit is not conductive and the analog electrical input signal is provided to a first converter only so as to set the first value of the output slope, and, if the analog electrical input signal exceeds said at least one electrical threshold, the threshold circuit is conductive and the analog electrical input signal is provided to the first converter and to at least one second converter included in the at least one threshold circuit so as to set the second value of the output slope.

The present disclosure also concerns a vehicle comprising the electrical circuit of signal conditioning as previously defined, or the measurement device above defined.

BRIEF DESCRIPTION OF THE DRAWINGS

Other features, purposes and advantages of the disclosure will become more explicit by means of reading the detailed statement of the non-restrictive embodiments made with reference to the accompanying drawings.

In the drawings, reference numbers may be reused to identify similar and/or identical elements.

DETAILED DESCRIPTION

Figure 1:
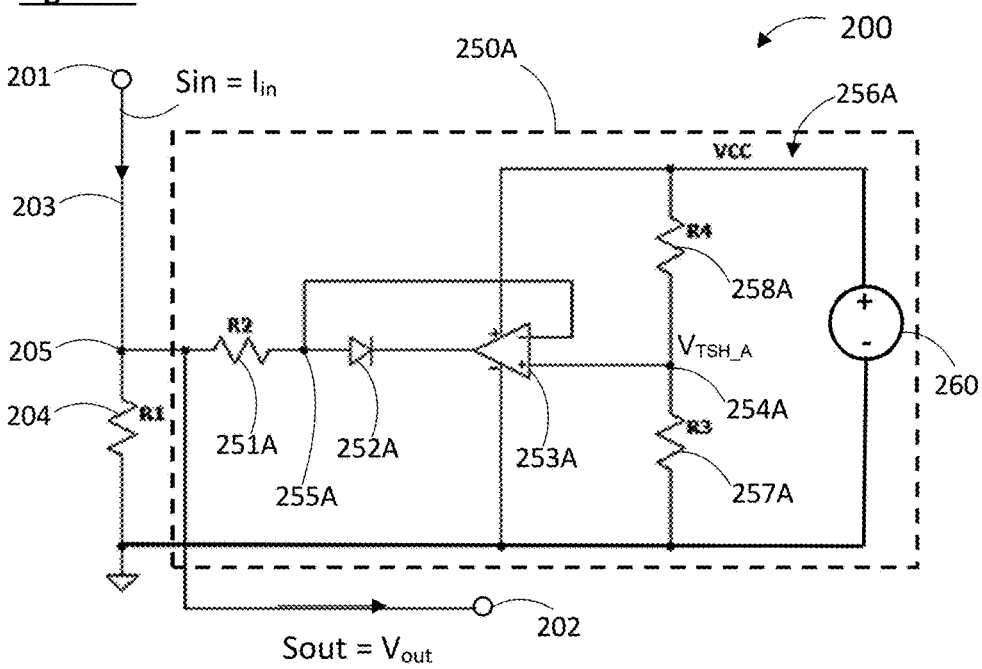
FIG. 1 shows an electrical circuit of signal conditioning according to a first embodiment.
Figure 2:
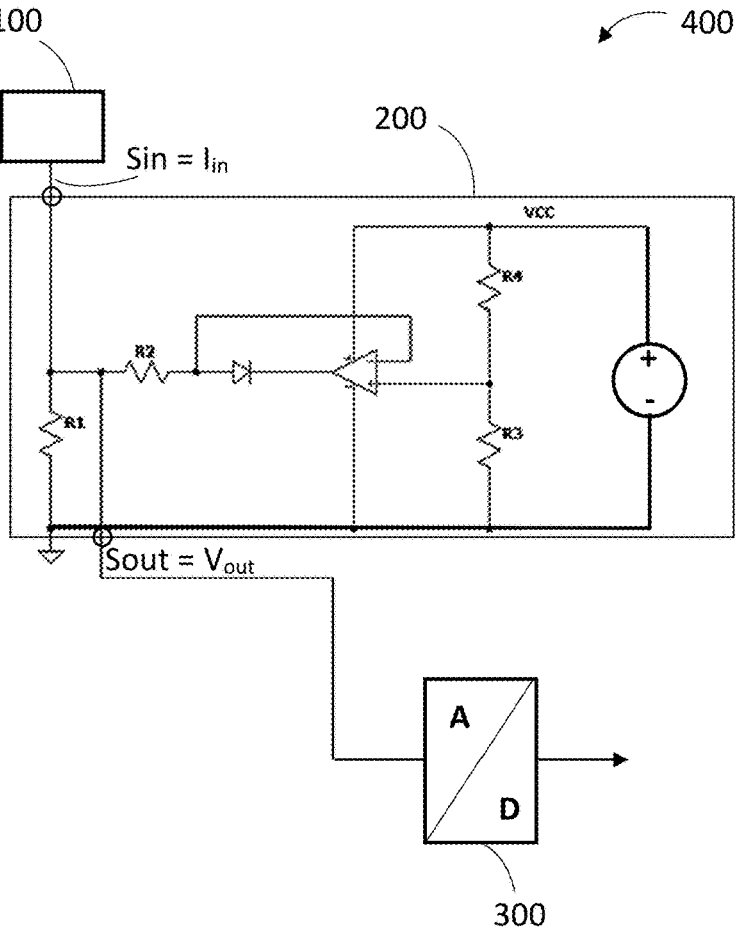
FIG. 2 shows a measurement device including the electrical circuit according to the first embodiment.

The present disclosure concerns an electrical circuit 200 of signal conditioning, and a measurement device 400 including the electrical circuit 200.

The electrical circuit of signal conditioning 200 or the measurement device 400 can be provided or included in a vehicle.

The measurement device 400 can include a sensor 100, the electrical circuit 200 and an analog-to-digital converter (ADC) 300.

In an embodiment, the electrical circuit 200 is connected in input to the sensor 100 and in output to the analog-to-digital converter 300. It has the function of conditioning an analog electrical input signal Sin transmitted by the sensor 100 for the ADC 300.

The sensor 100 can be configured to sense a voltage, a current or any other physical parameter (temperature, force, pressure, etc.) that is converted into current or voltage by the sensor 100. The sensor 100 is configured to output an analog electrical signal, that can be current or voltage, representative of the sensed physical parameter.

In operation, an analog electrical signal provided at the output of the sensor 100 can be transmitted to the electrical circuit 200 as an input signal Sin. The electrical signal 200 conditions or converts the analog electrical signal Sin to an analog electrical output signal Sout, based on a conditioning parameter. The analog electrical signal Sout provided at the output of the electrical circuit 200 can be transmitted to the analog to digital converter (ADC) 300.

The analog-to-digital converter 300 is responsible for converting the analog electrical signal Sout received from the output of the electrical circuit 200 to a digital signal, that can be termed as a digital measurement signal. In operation, the analog electrical output signal Sout can be converted by the ADC 300 to a digital signal including digital values representing the magnitude of the voltage or current at the output of the sensor 100.

Figure 6:
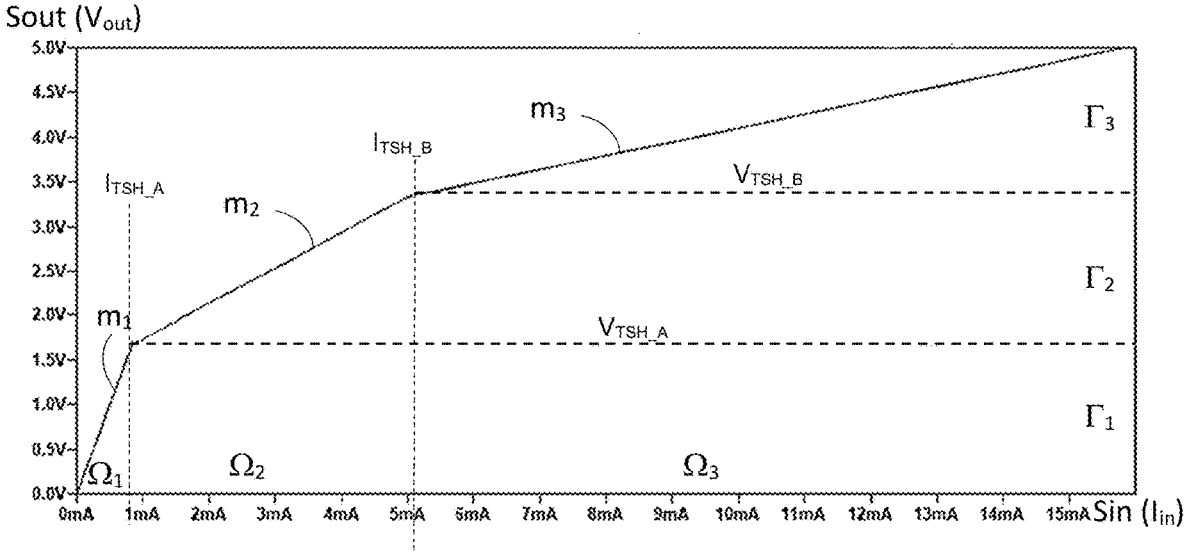
FIG. 6 shows a curve representing linear functions that relate an analog electrical input signal and an analog electrical output signal of the electrical circuit, according to the second embodiment.

The electrical circuit 200 is responsible for conditioning or converting the analog electrical input signal Sin, that is a current or voltage signal, into the analog electrical output signal Sout, that is a current or voltage signal, said analog electrical output signal Sout, using a conditioning parameter. In a particular embodiment, the conditioning parameter may be an output slope or conditioning gain, as illustrated for example in FIGS. 3 and 6. If the analog electrical input signal Sin is a current signal, the analog electrical output signal Sout can be either a current signal or a voltage signal. If the analog electrical input signal Sin is a voltage signal, the analog electrical output signal Sout can be either a voltage signal or a current signal.

Figure 3:
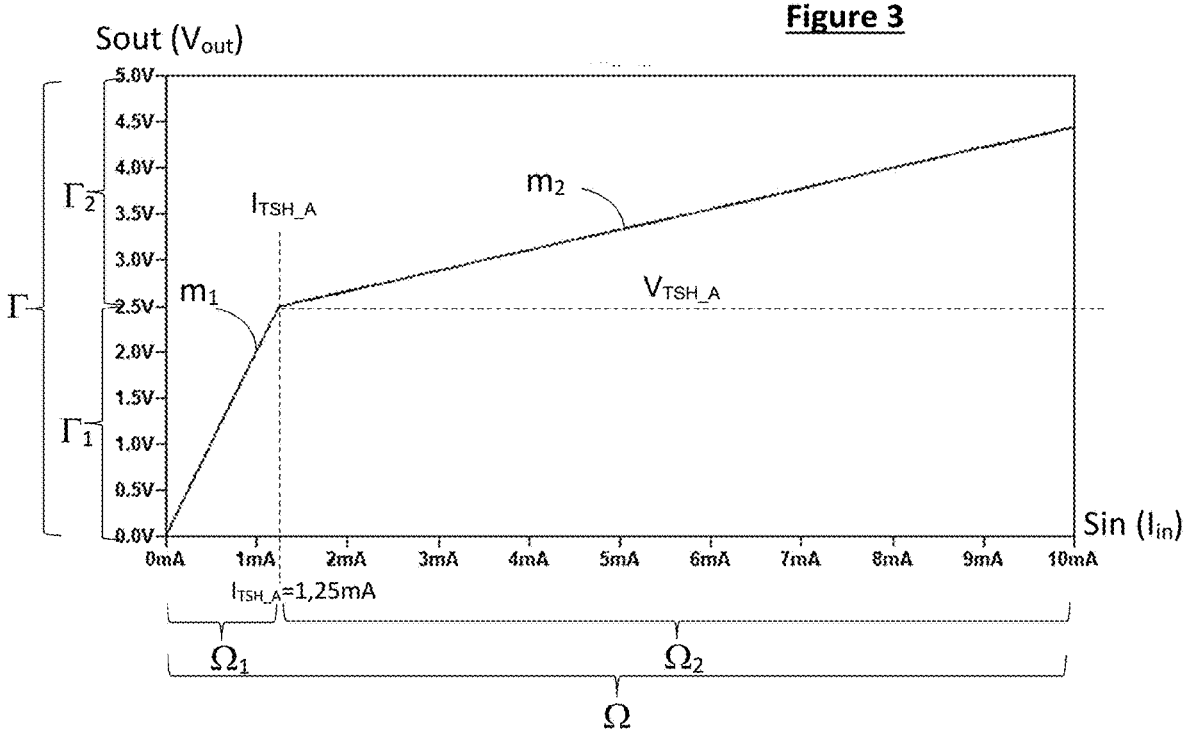
FIG. 3 shows a curve representing linear functions that relate an analog electrical input signal and an analog electrical output signal of the electrical circuit, according to the first embodiment.

In an embodiment, the analog electrical input signal Sin has analog values within a predetermined range $\Omega$. For example, if the signal Sin is the output current or voltage of the sensor 100, the range of current or voltage analog values at the output of the sensor 100 is known or predetermined. It can be provided by the manufacturer or determined by tests. Furthermore, the analog to digital converter 300 has a predetermined allowed range of analog input values F. An illustrative example of the ranges Q and F is shown in FIG. 3. In an embodiment, the conditioning parameter, for example an output slope or gain, is adapted to convert the analog electrical input signal Sin having analog values within the predetermined range of values Q into an analog electrical output signal Sout having analog values within the allowed range F of analog input values for the analog to digital convert 300.

In an embodiment, the electrical circuit 200 is configured to condition, or convert, the analog electrical input signal Sin to the analog electrical output signal Sout, based on different linear functions of the form:

$$Sout = m_i \times Sin + b_i$$

Where $m_i$ and $b_i$ are constants applicable over a given sub-range $\Omega i$; $m_i$ represents the constant value of the output slope, or gain, applicable within the sub-range $\Omega i$, $b_i$ represents the intercept value applicable within the sub-range $\Omega i$, $\Omega i$, with i=1, 2, . . . , represent different and successive sub-ranges of the range Q of values of the analog electrical input signal Sin, which do not overlap.

The output slope $m_i$ within the sub-range $\Omega i$ represents the ratio between a change in the analog electrical input signal Sin, that can be denoted $\Delta$Sin, and a corresponding change in the analog electrical output signal Sout, that can be denoted $\Delta$Sout. The output slope $m_i$ can be expressed as follows:

$$m_i = \frac{\Delta Sout}{\Delta Sin}$$

In other words, the output slope $m_i$ represents the rate of change of the analog electrical output signal Sout per unit change in the analog electrical input signal SinIt can be defined as a ratio of the change in Sout to the change in Sin, within the sub-range $\Omega_i$.

The electrical circuit 200 can have an input interface 201 for receiving the analog electrical input signal Sin and an output interface 202 for transmitting or outputting the analog electrical output signal Sout, as shown in FIG. 1. The input interface 201 can be connected to the sensor 100. The output interface 202 can be connected to the analog to digital converter 300.

The electrical circuit 200 may be an analog electronic circuit configured to operate on analog signals. In an embodiment, the electrical circuit 200 may be exclusively hardware. In other words, it may be free of software or digital means.

In a first embodiment illustrated in FIG. 1, the electrical circuit 200 further comprises a threshold circuit 250A configured to set a value of the conditioning parameter, that is a value $m_i$ of the output slope in the present embodiment, under control of the analog electrical input signal Sin, for example a current signal $I_{in}$, and based on a corresponding electrical threshold $I_{TSH\_A}$ or $V_{TSH\_A}$. The value $m_i$ of the conditioning parameter can be set automatically and dynamically based on the analog electrical input signal Sin. In other words, the value $m_i$ of the conditioning parameter can be set instantly or almost instantly based on the analog electrical input signal Sin. In this first embodiment, the output slope has two different values, namely a first value $m_1$ and a second value $m_2$, respectively if the analog electrical input signal $I_{in}$ is below said electrical threshold $I_{TSH\_A}$ and has analog values within a first range $\Omega 1$ and if the analog electrical input signal $I_{in}$ exceeds said electrical threshold $I_{TSH\_A}$ and has analog values within a second range $\Omega 2$. In an embodiment, the threshold circuit 250A is configured to set the second value $m_2$ of the output slope lower than the first value $m_i$ of the output slope.

The threshold circuit 250A is controlled by the analog electrical input signal $I_{in}$. In an embodiment, directly under control of the analog electrical input signal $I_{in}$, the threshold circuit 250A is non-conductive if the analog electrical input signal $I_{in}$ is below the electrical threshold $I_{TSH\_A}$ and conductive if the analog electrical input signal $I_{in}$ exceeds the electrical threshold $I_{TSH\_A}$. The conductive or non-conductive state of the threshold circuit 250A is automatically, dynamically, controlled by the analog electrical input signal $I_{in}$ (or Sin).

In an embodiment, the threshold circuit 250A is exclusively hardware, free of software or digital means.

In the first embodiment illustrated in FIG. 1, the electrical circuit 200 is configured to convert the analog current input signal Sin, also referred as $I_{in}$, into an analog voltage output signal Sout, also referred as $V_{out}$.

In this embodiment, the electrical circuit 200 comprises:
the input interface 201 to receive the analog electrical input signal Sin or $I_{in}$;
a first converter 204;
the threshold circuit 250A including a second converter 251A;
the output interface 202 to output the analog electrical output signal Sout or $V_{out}$.

In the present embodiment, the first converter 204 has two terminals respectively connected to an interconnection node 205 and the ground.

The second converter 251A has also two terminals respectively connected to the interconnection node 205 and to an anode side of a diode 252A of the threshold circuit 250A.

The input interface 201 is connected to the interconnection node 205 through an input path 203. In the present embodiment, the input path 203 is a current path configured to flow the current of the analog electrical input signal Sin or $I_{in}$. This input path 203 divides into a first current path through the first converter 204 and a second current path through the second converter 251A.

The first converter 204 can comprise a resistor R1, and the second converter 251A can comprise another resistor R2. The values of R1 and R2 can be different or identical. They are determined based on the desired values m1 and m2 of the output slope.

In the present embodiment, the output interface 202 is connected to the interconnection node 205. As a result, the output voltage Vou, is the voltage at the interconnection node 205.

The threshold circuit 250A includes the second converter 251A, the diode 252A, and an operational amplifier, or op-amp, 253A.

The diode 252A is connected in series to the second converter 251A.

In the first embodiment illustrated in FIG. 1, the resistor 251A has a first terminal connected to the interconnection node 205 and a second terminal connected to the anode side of the diode 252A.

The operational amplifier 253A may have the function of a voltage follower. It can comprise:
a first input connected to a node 254A having a fixed threshold voltage $V_{TSH\_A}$, said first input being the positive input or non-inverting input of the operational amplifier 253A;
a second input connected to a node 255A of the threshold circuit 250A, interposed between the second converter 251A and an anode side of the diode 252A, said second input being the negative or inverting input of the operational amplifier 253A;
an output connected to a cathode side of the diode 252A.

The electrical assembly including the diode 252A and the operational amplifier 253A allows that the voltage at the node 255A (i.e., at the anode side of the diode 252A) follows or tracks the voltage provided at the first input of the operational amplifier 253A that is the fixed threshold voltage $V_{TSH\_A}$.

For example, the fixed threshold voltage $V_{TSH\_A}$ can be provided by a voltage divider circuit 256A connected to a voltage source 260 providing a constant or fixed voltage VCC. The voltage divider circuit 256A can comprise an assembly of two resistors 257A, 258A connected in series, having respective resistance values R3, R4. The resistor assembly 257A, 258A can have one terminal connected to the voltage source 260 and another terminal connected to the ground. A node between the two resistors 257A, 258A can be connected to the first input of the operational amplifier 253A.

In an embodiment, the voltage source 260 can also power the operational amplifier 253A.

The values of the resistors 257A, 258A are chosen to derive the desired threshold voltage $V_{TSH\_A}$ from the source voltage VCC, at the node 254A connected to the operational amplifier 253A. The threshold voltage $V_{TSH\_A}$ is derived from the source voltage VCC based on the following expression:

$$V_{TSH\_A} = \frac{R3}{R3 + R4} \times VCC$$

Figure 4:
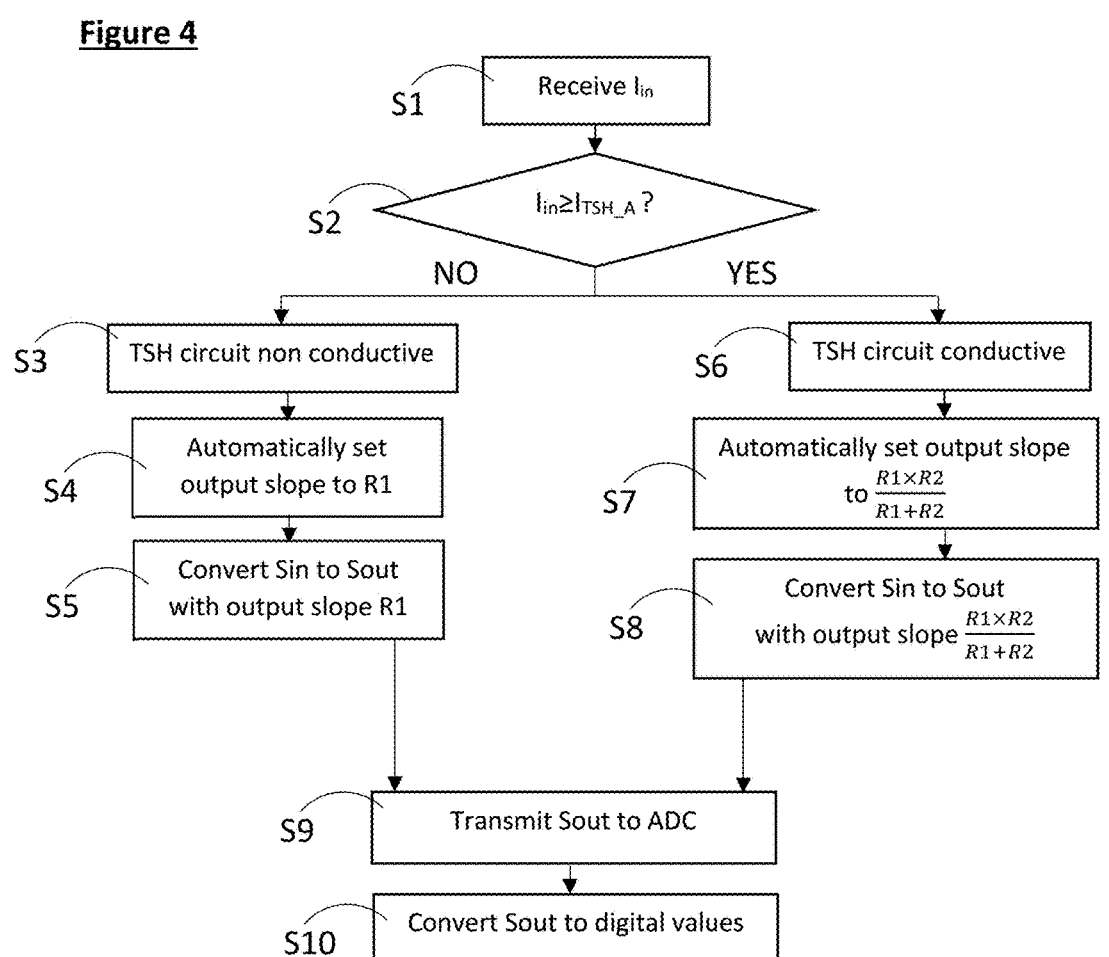
FIG. 4 shows a flowchart of a method of signal conditioning, according to the first embodiment.

The method for conditioning an analog electrical input signal, corresponding to the operation of the electrical circuit 200, will now be described in reference to FIG. 4.

In a first step S1, the electrical circuit 200 receives the analog electrical input signal Sin, for example an analog current signal $I_{in}$, through the input interface 201. This analog current signal $I_{in}$ can be transmitted by the sensor 100.

The current signal $I_{in}$ flowing through the input path 203 either entirely flows through the first resistor 204 (R1), if the current signal $I_{in}$ is below a threshold current $I_{TSH\_A}$, or divides into two current signals $I_{in1}$ and $I_{in2}$ flowing through the first resistor 204 (R1) and the second resistor 251A (R2), if the current signal $I_{in}$ exceeds the threshold current ITSH_A.

The threshold current ITSH_A corresponds to the value of the input current Iin above which the diode 252A is conductive and below which the diode 252A is not conductive. It is derived from the threshold voltage $V_{TSH\_A}$, as explained later in more detail.

If the current $I_{in}$ is low, below the threshold current $I_{TSH\_A}$ (step S2), the voltage at the interconnection node 205 is low, below the threshold voltage $V_{TSH\_A}$, and the diode 252A does not conduct current. The threshold circuit 250A is not conductive, in a step S3. As a result, the current $I_{in}$ received by the input interface 201 entirely flows through the first converter 204, here the resistor R1. In that case, the output slope of electrical circuit 200 is automatically set to the value $m_1$ that is equal to the resistance value R1, in a step S4. Thus, the electrical circuit 200 converts the analog electrical input signal Sin, here the input current signal $I_{in}$, into the analog electrical output signal Sout, here the output voltage signal $V_{out}$, based on the converter 204 or resistor R1 only, in a step S5. As a result, the analog output voltage signal $V_{out}$ derives from the analog input current $I_{in}$ based on the following equation:

$$V_{out} = R1 \times I_{in} \text{ for } V_{out} < V_{TSH\_A} \text{ and } I_{in} < I_{TSH\_A}$$

In that case, namely for $V_{out} < V_{TSH\_A}$ and $I_{in} < I_{TSH\_A}$, the analog electrical output signal, here $V_{out}$, has an output slope which value m1 is equal to the resistance value R1 of the resistor 204, as illustrated in FIG. 3. In other words, the value of the output slope is equal to R1 within the sub-range $\Omega1$ of analog values of the input current $I_{in}$ between 0 and $I_{TSH\_A}$.

Since the voltage at the node 255A is equal to, or follows, the threshold voltage $V_{TSH\_A}$ of the threshold circuit 250A, the diode 252A starts conducting current if the voltage at the interconnection node 205, namely $V_{out}$, that is equal to $R1 \times I_{in}$ if the diode 252A is not conductive, reaches and then exceeds the threshold voltage $V_{TSH\_A}$. In other words, the diode 252A starts conducting current if the current $I_{in}$ reaches the threshold current $I_{TSH\_A}$ based on the following expression:

$$R1 \times I_{in} = R1 \times I_{TSH\_A} = V_{TSH\_A}$$

Therefore, the threshold current $I_{TSH\_A}$ can be derived from the threshold voltage $V_{TSH\_A}$ and the resistance value R1, based on the following equation:

$$I_{TSH\_A} = \frac{V_{TSH\_A}}{R1}$$

If the current $I_{in}$ reaches or exceeds the threshold current $I_{TSH\_A}$, the output voltage $V_{out}$ at the interconnection node 205, reaches or exceeds the threshold voltage $V_{TSH\_A}$, and the diode 252A starts conducting. The threshold circuit 250A is conductive, in a step S6. As a result, the current $I_{in}$ received by the input interface 201 divides into a first current $I_{in1}$ flowing through the first converter 204, here the resistor R1, and a second current $I_{in2}$ flowing through the second converter 251A, here the resistor R2. In that case, the electrical circuit 200 converts the analog electrical input signal Sin, here the input current signal $I_{in}$, into the analog electrical output signal Sout, here the output voltage signal $V_{out}$, based on the converter 204 or resistor R1 and the converter 251A or resistor R2, in a step S8. The analog output voltage signal $V_{out}$ derives from the analog input current $I_{in}$ based on the following equation:

$$V_{out} = \frac{I_{in} \cdot R1 \cdot R2 + V_{TSH_A} \cdot R1}{R1 + R2}$$

In that case, namely if the input current $I_{in}$ is equal to or exceeds the threshold current $I_{TSH\_A}$, the output slope of electrical circuit 200 is automatically set to the value $m_2$ that is equal to $$\frac{R1 \times R2}{R1 + R2},$$

in a step S7. This can be done instantly or almost instantly based on the input current $I_{in}$. In other words, the value of the output slope is equal to $$\frac{R1 \times R2}{R1 + R2}$$

within the sub-range $\Omega2$ of analog values of the input current $I_{in}$ from $I_{TSH\_A}$ and above $I_{TSH\_A}$.

The threshold circuit 250A is configured so that the second value $m_2$ of the output slope is lower than the first value $m_1$ of the output slope. In the present embodiment, the value of the resistor R1 is greater than the resistance value provided by the parallel connection of the two resistors R1 and R2 that is equal to $$\frac{R1 \times R2}{R1 + R2}.$$

In other words:

$$R1 > \frac{R1 \times R2}{R1 + R2}.$$

Let's consider the following illustrative and non-limitative example represented in FIG. 3 where:

$$VCC = 5 \text{ V}$$

$$R3 = R4 = 10 \text{ kOhms}$$

$$V_{TSH\_A} = 2.5 \text{ V}$$

$$R1 = 2000 \text{ Ohms}$$

$$R2 = 333 \text{ Ohms}$$

$$I_{TSH\_A} = \frac{V_{TSH\_A}}{R1} = \frac{2.5}{2000} = 1.25 \text{ mA};$$

$$m_1 = \frac{2.5[V]}{1.25[mA]} = 2 \frac{[V]}{[mA]}; m_2 = \frac{2.5[V]}{(10-1.25)[mA]} = 0.286 \frac{[V]}{[mA]};$$

$$\Omega1 = [0; 1.25 \text{ mA}[ \text{ for } I_{in} \text{ or } [0; 2.5 \text{ V}[ \text{ for } V_{out}.$$

$$\Omega2 = [1.25 \text{ mA}; 10 \text{ mA}] \text{ for } I_{in} \text{ or } [2.5 \text{ V}; 5 \text{ V}[ \text{ for } V_{out};$$

According to the present embodiment, the analog current input signal Iin controls the threshold circuit 250A, based on the threshold voltage $V_{TSH\_A}$ or the corresponding threshold current $I_{TSH\_A}$. The threshold circuit 250A sets automatically or dynamically the value of the output slope of the analog voltage output signal $V_{out}$, under control of the analog current input signal $I_{in}$. If $I_{in}$ is below the threshold current $I_{TSH\_A}$, in other words if $V_{out}$ is below the threshold voltage $V_{TSH\_A}$, the threshold circuit 250A is not conductive, and the current input signal $I_{in}$ entirely flows through the first converter 204, which sets the first value m1 of the output slope. If $I_{in}$ reaches or exceeds the threshold current $I_{TSH\_A}$, in other words if $V_{out}$ reaches or exceeds the threshold voltage $V_{TSH\_A}$, the threshold circuit 250A is conductive, and the current input signal $I_{in}$ divides into two current signals $I_{in1}$ and $I_{in2}$ that are provided respectively to the first converter 204 and to the second converter 251A, which sets the second value m2 of the output slope.

Then, in a step S9, the analog electrical output signal Sout, or $V_{out}$, is transmitted by the electrical circuit 200 to the analog to digital converter 300, in a step S9.

In a step S10, the analog electrical output signal Sout, or $V_{out}$, is converted into digital values by the analog to digital converter 300.

As previously explained, the analog electrical input signal Sin, that can be received from the sensor 100, may have analog values within the predetermined range Ω. For example, as illustrated in FIG. 3, the analog current input signal $I_{in}$ may range from 0 mA to 10 mA.

The analog to digital converter 300 can be characterized by an allowed range of analog input values and a resolution. In the example illustrated in FIG. 3, the allowed range of analog input values is 0V-5V. For example, the resolution of the ADC can be 12 bits, which represents 4096 ($4096=2^{12}$) different levels or counts or units of digital values. The resolution of the ADC 300 indicates the number of different, i.e. discrete, digital values it can produce. The ADC 300 can encode the analog input, here Sout or $V_{out}$ provided by the output of the electrical circuit 200, comprised within the range 0V-5V, to one in 4096 different levels (212=4096).

Based on the relation between Sin (e.g., $I_{in}$) and Sout (e.g., $V_{out}$), a resolution of the measurement device 400, or measurement resolution, can also be expressed as a number of units of values of the analog electrical input signal Sin, or $I_{in}$, per count or level or units of digital values.

Let's consider the illustrative example of the ADC 300 having a range of allowed analog input values 0V-5V and a resolution of 12 bits ($2^{12}=4096$ counts or units of digital values). With reference to FIG. 3, within the sub-range Ω1, that corresponds to the voltage range [0; 2.5V[ for $Vo_{ut}$ and represents a first half of the ADC range of allowed analog input values 0V-5V, the ADC 300 can produce 2048 counts or discrete units of digital values, which is half of the total number of discrete digital values it can produce. In the same manner, within the sub-range Ω2, that corresponds to the voltage range [2.5V; 5V[ for $V_{out}$ and represents a second half of the ADC range of allowed analog input values 0V-5V, the ADC 300 can produce 2048 counts or discrete units of digital values, which is half of the total number of discrete digital values it can produce.

Within the sub-range Ω1, the measurement resolution can be expressed as follows:

$$\text{resolution} = \frac{I_{in}\ \text{range width over}\ \Omega 1}{\text{number of counts produced by} ADC\ \text{over}\ \Omega 1}$$

In the example of FIG. 3, the analog input current $I_{in}$ ranges from 0 mA to 1.25 mA, and the resolution can be determined as follows:

$$\text{resolution} = \frac{1.25\ \text{mA}}{2048} = 0.61\ \mu\text{A per count or unit of digital value}$$

Within the sub-range Ω2, the measurement resolution can be expressed as follows:

$$\text{resolution} = \frac{I_{in}\ \text{range width over}\ \Omega 2}{\text{number of counts produced by} ADC\ \text{over}\ \Omega 2}$$

In the example of FIG. 3, the analog input current $I_{in}$ ranges from 1.25 mA to 10 mA, and the resolution can be determined as follows:

$$\text{resolution} = \frac{8.75\ \text{mA}}{2048} = 4.27\ \mu\text{A per count or unit of digital value}$$

Thus, the resolution for low input current $I_{in}$ within the sub-range Ω1 is much higher than the resolution for high input current $I_{in}$ within the sub-range Ω2. The digital measurements are more precise than for low input current $I_{in}$ within the sub-range Ω1 than for high input current $I_{in}$ within the sub-range Ω2. The values of the output slope within the different sub-ranges Ω1, Ω2, based on the resistance values R1, R2, are chosen to have the desired values of measurement resolution within the sub-ranges Ω1, Ω2.

Let's consider the example of an electrical circuit 200 that does not include the threshold circuit 250A and having a resistor 204 with a resistance value R1 chosen to convert the analog input current $I_{in}$ within the entire range Q (e.g., Ω=[0 mA; 10 mA]) to the analog output voltage $V_{out}$ within the entire range F of allowed input values for the ADC 300 (e.g., Γ=[0V; 5V]). In that case, the resolution of measurement is equal to $$\frac{10\ \text{mA}}{4096} = 2.44\ \mu\text{A per count or unit of digital value}$$

The present disclosure allows to adapt the resolution of measurement based on the analog electrical input signal Sin, or $I_{in}$, to have a better resolution for lower values the analog electrical input signal Sin, or $I_{in}$, than for higher values the analog electrical input signal Sin, or $I_{in}$.

A first advantage of the present disclosure is that only one measurement has to be done to measure the analog electrical input signal Sin, or $I_{in}$. In other words, the analog electrical input signal Sin, or $I_{in}$, can be directly measured, without need to perform a pre-measurement. A second advantage is that the electrical circuit 200 sets the output slope, that determines the measurement resolution of the measurement device 400, automatically, dynamically, based on the analog electrical input that is to be measured. A third advantage is that the digital measurement is immediate or almost immediate. As a result, there is no risk of losing measurements. A fourth advantage is that the performance of the electrical circuit 200 is not influenced by the temperature. In particular, there is no diode temperature problem because ir is compensated by the operational amplifier 253A. A fifth advantage is that the electrical circuit 200 does not require software and/or computing means.

The combination of the diode 252A and the operational amplifier 253A allows to have a very precise measurement. The diode has a voltage drop that may change depending on the temperature. For example, the voltage drop of the diode may be around 0.6-0.7 V. But this voltage drop changes like 2 mV per Kelvin. So, if a vehicle including the measurement device 400 can operate between −40° C. and +85° C., the voltage across the diode can change more than 100 mV. This may result in measurement errors. With the present disclosure, the voltage drop of the diode 252A is compensated by the operational amplifier 253A. The operational amplifier 253A has also an offset voltage, typically around 1-2 mV, but this is much lower. Furthermore, the operational amplifier 253A has much lower temperature dependency.

Figure 5:
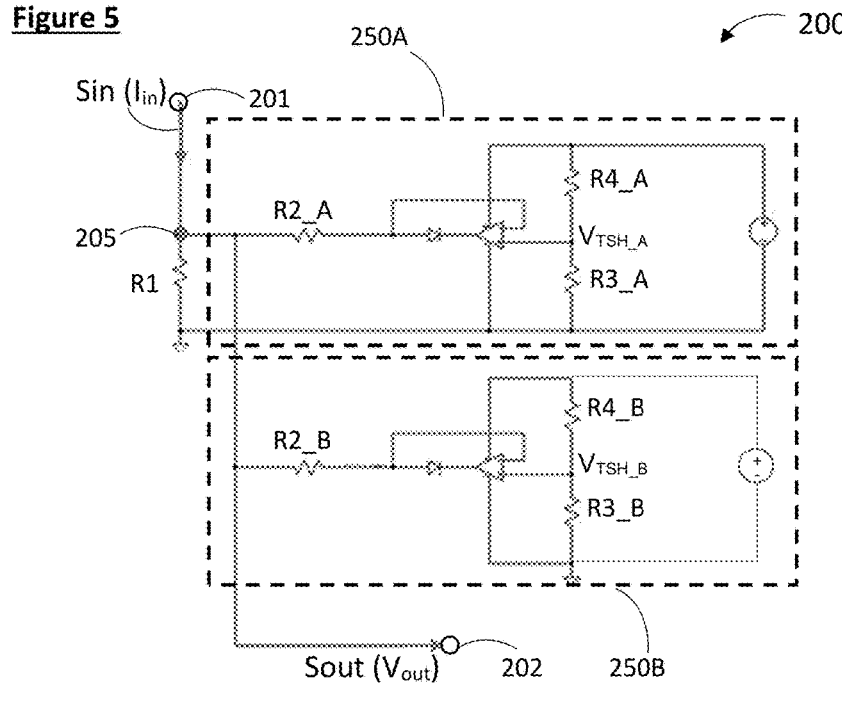
FIG. 5 shows an electrical circuit of signal conditioning according to a second embodiment.

In a second embodiment illustrated in FIG. 5, the electrical circuit comprises two threshold circuits 250A and 250B providing two electrical thresholds, different from each other, here two voltage thresholds $V_{TSH\_A}$ and $V_{TSH\_B}$ (e.g. 1.6V and 3.4V in FIG. 5).

The thresholds circuits 250A and 250B of the second embodiment are similar to the threshold circuit 250A of the first embodiment represented in FIG. 1, and will not be described in more detail. Each threshold circuit 250A, 250B has a resistor R2_A, R2_B, acting as a converter, having one terminal connected to the interconnection node 205, to which the output interface is connected.

With the electrical circuit 200 according to the second embodiment, the output slope has three different values $m_1$, $m_2$, $m_3$ respectively within three sub-ranges $\Omega1$, $\Omega2$, $\Omega3$ of analog values of the analog electrical input signal $I_{in}$, corresponding to three sub-ranges $\Gamma1$, $\Gamma2$, $\Gamma3$ of analog values of the analog electrical output signal $V_{out}$.

The threshold circuits may be configured to set the second value of the output slope lower than the first value of the output slope, and the third value of the output slope lower that the second value of the output slope.

In other embodiments, the electrical circuit of signal conditioning 200 may have more than two threshold circuits to set more than three output values.

Although an overview of the inventive subject matter has been described with reference to specific example embodiments, various modifications and changes may be made to these embodiments without departing from the broader spirit and scope of embodiments of the present invention. For example, various embodiments of features thereof may be mixed and matched or made optional by a person of ordinary skill in the art. Therefore, the Detailed Description is not to be taken in a limiting sense, and the scope of various embodiments is defined only by the appended claims, along with the full range of equivalents to which such claims are entitled.

The term non-transitory computer-readable medium does not encompass transitory electrical or electromagnetic signals propagating through a medium (such as on a carrier wave). Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The term "set" generally means a grouping of one or more elements. The elements of a set do not necessarily need to have any characteristics in common or otherwise belong together. The phrase "at least one of A, B, and C" should be construed to mean a logical (A OR B OR C), using a non-exclusive logical OR, and should not be construed to mean "at least one of A, at least one of B, and at least one of C." The phrase "at least one of A, B, or C" should be construed to mean a logical (A OR B OR C), using a non-exclusive logical OR.

The invention claimed is:

1. An electrical circuit for conditioning an analog electrical input signal into an analog electrical output signal, the electrical circuit comprising:
an input interface configured to receive the analog electrical input signal;
a first converter; and
a threshold circuit configured to set a value of a conditioning parameter, under control of the analog electrical input signal and based on an electrical threshold, wherein;
the threshold circuit includes a second converter,
setting the value of the conditioning parameter includes:
in response to the analog electrical input signal being below the electrical threshold:

the threshold circuit is not conductive, and
the input interface provides the analog electrical input signal to the first converter only, so as to set a first value of the conditioning parameter, and
in response to the analog electrical input signal exceeding the electrical threshold:
the threshold circuit is conductive, and
the input interface provides the analog electrical input signal to the first converter and to the second converter, so as to set a second value of the conditioning parameter, and
the second value is different from the first value.

2. The electrical circuit of claim 1 wherein the conditioning parameter is an output slope corresponding to a ratio between a change in the analog electrical input signal and a corresponding change in the analog electrical output signal.

3. The electrical circuit of claim 1, wherein the threshold circuit is configured to set the second value of the conditioning parameter lower than the first value of the conditioning parameter.

4. The electrical circuit according to claim 1 wherein:
the input interface is configured to flow a current corresponding to the analog electrical input signal, and
the electrical circuit is configured to divide an input current path into a first current path through the first converter and a second current path through the second converter.

5. The electrical circuit of claim 1, wherein the threshold circuit includes:
a diode connected in series to the second converter; and
a voltage follower operational amplifier including:
a first input connected to a fixed threshold voltage node,
a second input connected to a node between the second converter and an anode side of the diode, and
an output connected to a cathode side of the diode, wherein the electrical threshold of the analog electrical input signal derives from the fixed threshold voltage node.

6. The electrical circuit of claim 5 wherein the first input of the voltage follower operational amplifier is connected to a voltage source through a voltage divider circuit.

7. The electrical circuit of claim 1, wherein the first converter includes a first resistor and the second converter includes a second resistor.

8. The electrical circuit of claim 1 further comprising:
a second threshold circuit configured to provide a second electrical threshold that is higher than the electrical threshold;
wherein the threshold circuit is configured to set the conditioning parameter to:
in response to the analog electrical input signal exceeding the electrical threshold and being below the second electrical threshold, the second value, and
in response to the analog electrical input signal exceeding the second electrical threshold, a third value different from the first value and the second value.

9. The electrical circuit of claim 1 further comprising:
an analog-to-digital converter configured to receive as input the analog electrical output signal,
wherein the conditioning parameter is adapted to convert the analog electrical input signal into the analog electrical output signal within an allowed range of analog input values for the analog-to-digital converter.

10. A vehicle comprising the electrical circuit of claim 1.

11. A measurement device for measuring a physical parameter, the measurement device comprising:

the electrical circuit of claim 9; and a sensor configured to sense the physical parameter and output an analog electrical signal representative of the sensed physical parameter, wherein the electrical circuit is configured to receive as input the analog electrical signal from the sensor and condition the analog electrical signal to a digital measurement signal.

12. A vehicle comprising the measurement device of claim 11.

13. A method for conditioning an analog electrical input signal to an analog electrical output signal, the method comprising:

receiving the analog electrical input signal at an input interface;

setting a value of a conditioning parameter using a threshold circuit of an electrical circuit, by:

in response to the analog electrical input signal being below an electrical threshold, providing the analog electrical input signal to a first converter only, so as to set a first value of the conditioning parameter, wherein the threshold circuit is not conductive, and in response to the analog electrical input signal received at the input interface exceeding the electrical threshold, providing the analog electrical input signal to the first converter and to a second converter of the threshold circuit, so as to set a second value of the conditioning parameter that is different from the first value, wherein the threshold circuit is conductive; and using the electrical circuit, conditioning the analog electrical input signal into the analog electrical output signal based on the conditioning parameter.

14. The method of claim 13 wherein the conditioning parameter is an output slope corresponding to a ratio between a change in the analog electrical input signal and a corresponding change in the analog electrical output signal.

\* \* \* \* \*